US011309233B2

(12) United States Patent
Zhang et al.

(10) Patent No.: US 11,309,233 B2
(45) Date of Patent: Apr. 19, 2022

(54) POWER SEMICONDUCTOR PACKAGE HAVING INTEGRATED INDUCTOR, RESISTOR AND CAPACITOR

(71) Applicant: Alpha and Omega Semiconductor (Cayman), Ltd., Grand Cayman (KY)

(72) Inventors: Xiaotian Zhang, San Jose, CA (US); Mary Jane R. Alin, Shanghai (CN); Bo Chen, Shanghai (CN); David Brian Oraboni, Jr., San Jose, CA (US); Long-Ching Wang, Cupertino, CA (US); Jian Yin, San Ramon, CA (US)

(73) Assignee: ALPHA AND OMEGA SEMICONDUCTOR (CAYMAN), LTD., Grand Cayman (KY)

( * ) Notice: Subject to any disclaimer, the term of this patent is extended or adjusted under 35 U.S.C. 154(b) by 32 days.

(21) Appl. No.: 16/801,023

(22) Filed: Feb. 25, 2020

(65) Prior Publication Data

US 2021/0082793 A1    Mar. 18, 2021

Related U.S. Application Data

(63) Continuation-in-part of application No. 16/575,193, filed on Sep. 18, 2019.

(51) Int. Cl.
*H01L 23/495* (2006.01)
*H01L 23/31* (2006.01)
*H01L 25/16* (2006.01)
*H01L 23/00* (2006.01)

(52) U.S. Cl.
CPC .... *H01L 23/49575* (2013.01); *H01L 23/3107* (2013.01); *H01L 23/4952* (2013.01); *H01L 23/49503* (2013.01); *H01L 23/49562* (2013.01); *H01L 24/48* (2013.01); *H01L 25/16* (2013.01); *H01L 2224/48245* (2013.01); *H01L 2924/1205* (2013.01); *H01L 2924/1206* (2013.01); *H01L 2924/1207* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 8,810,013 B2 | 8/2014 | Yang et al. | |
| 9,478,483 B2 | 10/2016 | Sato et al. | |
| 2011/0159284 A1* | 6/2011 | Choi | C09J 163/00 428/355 EP |
| 2011/0228507 A1* | 9/2011 | Yin | H01L 23/49531 361/811 |
| 2016/0360354 A1 | 12/2016 | Cho et al. | |
| 2018/0102306 A1* | 4/2018 | Cho | H01L 22/20 |
| 2020/0176429 A1* | 6/2020 | Chen | H01L 23/49555 |

* cited by examiner

*Primary Examiner* — Nilufa Rahim
(74) *Attorney, Agent, or Firm* — Chen-Chi Lin

(57) ABSTRACT

A power semiconductor package comprises a lead frame, a low side field-effect transistor (FET), a high side FET, a capacitor, a resistor, an inductor assembly, a first plurality of bonding wires, and a molding encapsulation. In one example, an entirety of the inductor assembly is disposed at a position higher than an entirety of the low side FET, higher than an entirety of the high side FET, and higher than an entirety of the first plurality of bonding wires. In another example, a bottom surface of the low side FET and a bottom surface of the inductor assembly are co-planar.

18 Claims, 3 Drawing Sheets

POWER SEMICONDUCTOR PACKAGE HAVING INTEGRATED INDUCTOR, RESISTOR AND CAPACITOR

CROSS-REFERENCE TO RELATED APPLICATIONS

This patent application is a Continuation in Part (CIP) application of a pending application Ser. No. 16/575,193 filed on Sep. 18, 2019. The Disclosure made in the patent application Ser. No. 16/575,193 is hereby incorporated by reference.

FIELD OF THE INVENTION

This invention relates generally to a power semiconductor package. More particularly, the present invention relates to a driver metal-oxide-silicon transistor (DrMOS) having an integrated inductor, an integrated capacitor, and an integrated resistor.

BACKGROUND OF THE INVENTION

A conventional DrMOS has an inductor outside of the DrMOS package. FIG. 2 of U.S. Pat. No. 10,111,333 to Yin et al. has an inductor in a switching-power-supply module. The present disclosure has an integrated inductor, an integrated resistor, and an integrated capacitor in the DrMOS package. The present disclosure does not use metal clips. In one example, a size of the package is reduced from 7 mm×7 mm×5 mm to 6 mm×6 mm×5 mm. The current is reduced from 20-60 amperes to less than 10 amperes.

The power semiconductor package of the present disclosure comprises a controller, two field-effect transistors (FETs), an integrated capacitor, an integrated resistor, and an inductor. The advantages include a smaller form factor, better thermal dissipation, and higher electrical efficiency because of the integrated inductor. With an integrated approach, a complete switching power stage is optimized with regard to driver and FET dynamic performance, system inductance, and power FET $R_{DS(ON)}$.

SUMMARY OF THE INVENTION

The present invention discloses a power semiconductor package comprising a lead frame, a low side field-effect transistor (FET), a high side FET, a capacitor, a resistor, an inductor assembly, a first plurality of bonding wires, and a molding encapsulation.

In one example, an entirety of the inductor assembly is disposed at a position higher than an entirety of the low side FET, higher than an entirety of the high side FET, and higher than an entirety of the first plurality of bonding wires. In another example, a bottom surface of the low side FET and a bottom surface of the inductor assembly are co-planar.

DETAILED DESCRIPTION OF THE INVENTION

Figure 1:
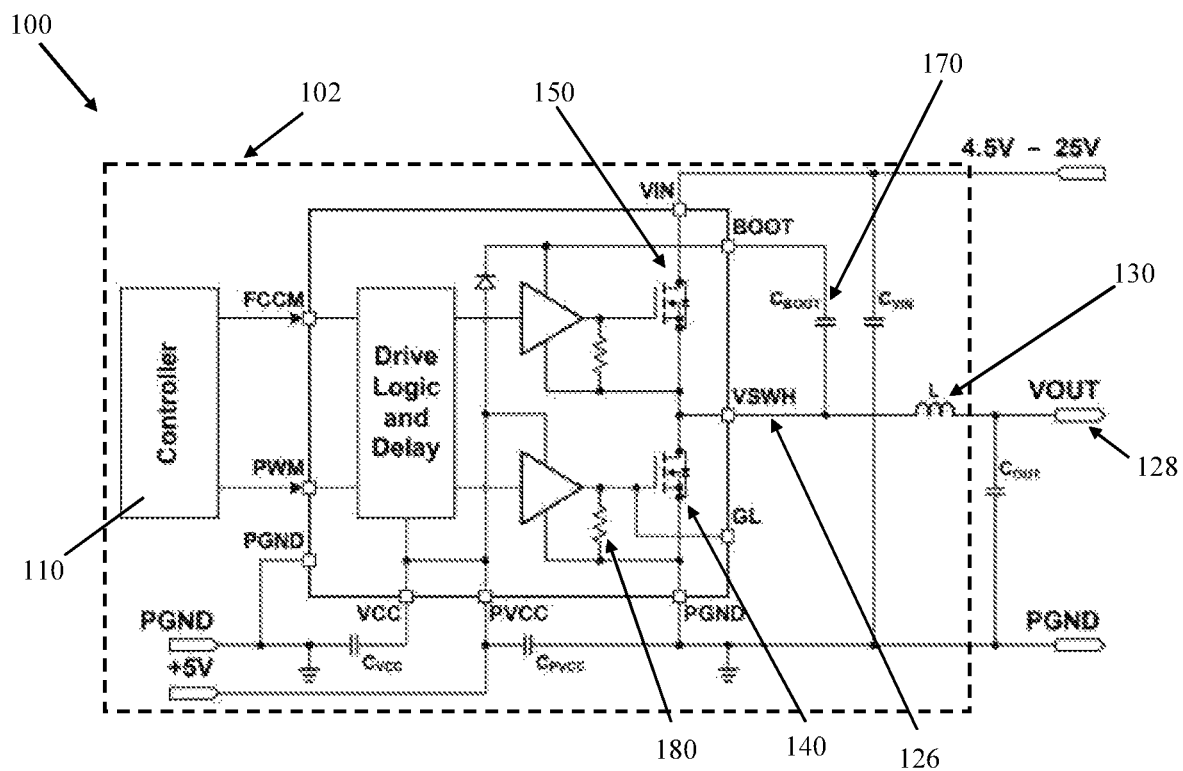
FIG. 1 is a circuit diagram of a DrMOS in examples of the present disclosure.

FIG. 1 is a circuit diagram 100 of a DrMOS in examples of the present disclosure. The DrMOS comprises a sub-package 102. The sub-package 102 comprises a controller 110, an inductor 130, a low side FET 140, and a high side FET 150, a plurality of capacitors 170, and a plurality of resistors 180.

Figure 2A:
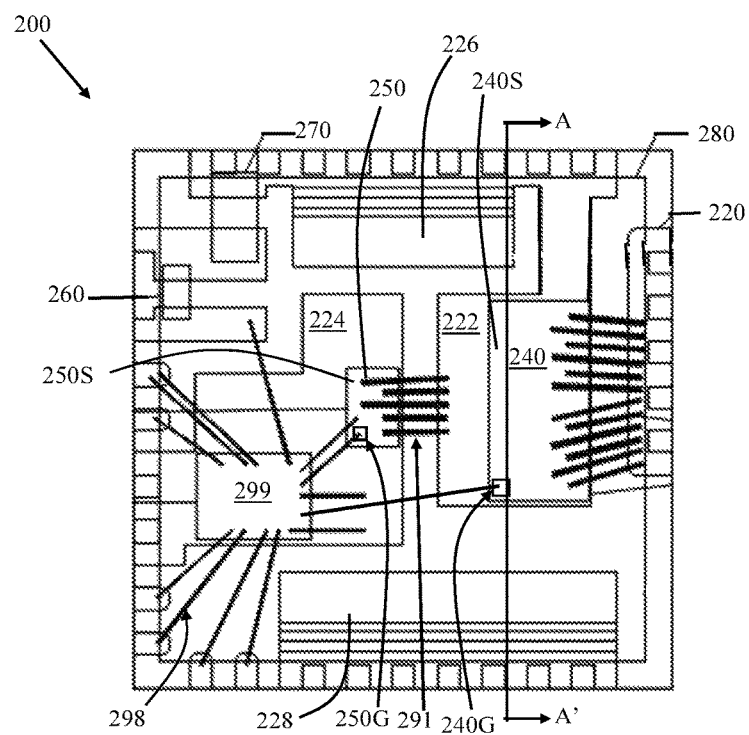
FIG. 2A is a top view and FIG. 2B is a cross sectional plot along AA' of a power semiconductor package in examples of the present disclosure.
Figure 2B:
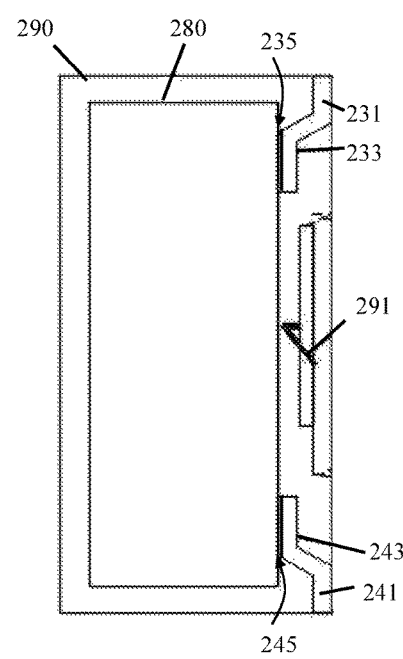

FIG. 2A is a top view and FIG. 2B is a cross sectional plot along AA' of a power semiconductor package 200 in examples of the present disclosure. The power semiconductor package 200 comprises a lead frame 220, a low side field-effect transistor (FET) 240, a high side FET 250, a capacitor 260, a resistor 270, an inductor assembly 280, a first plurality of bonding wires 291, and a molding encapsulation 290. The lead frame 220 comprises a first die paddle 222, a second die paddle 224 adjacent the first die paddle 222, a first end paddle 226 adjacent to both the first die paddle 222 and the second die paddle 224, and a second end paddle 228 adjacent to both the first die paddle 222 and the second die paddle 224 but separated from the first end paddle 226 by the first die paddle 222 and the second die paddle 224. The first end paddle 226 is electrically connected to the first die paddle 222 and serves as a switching node VSWH terminal 126 of FIG. 1. The second end paddle 228 is electrically isolated from other parts of the lead frame and serves as a Vout terminal 128 of FIG. 1. The first end paddle 226 and the second end paddle 228 are disposed at an elevation higher than the first die paddle 222 and the second die paddle 224

The low side FET 240 has a bottom surface drain electrode attached to the first die paddle 222. The low side FET 240 comprises a source electrode 240S and a gate electrode 240G on a top surface of the low side FET 240. The high side FET 250 has a bottom surface drain electrode attached to the second die paddle 224. The high side FET 250 comprises a source electrode 250S and a gate electrode 250G on a top surface of the high side FET. The first plurality of bonding wires 291 connect the top surface source electrode of the high side FET 250 to the first die paddle 222.

A first lead 231 of the lead frame electrically connects to a first terminal of the inductor assembly 280 stacking on the first end paddle 226. A second lead 241 of the lead frame electrically connects to a second terminal of the inductor assembly 280 stacking on the second end paddle 228. The first lead 231 comprises a first elevated section 233 above the first die paddle 222 and the second die paddle 224. The second lead 241 comprises a second elevated section 243 above the first die paddle 222 and the second die paddle 224. At least a portion of the first elevated section 233 forms the first end paddle 226 and at least a portion of the second elevated section 243 forms the second end paddle 228. The first elevated section 233 of the first lead 231 is electrically and mechanically connected to the inductor assembly 280 by a first conductive material 235. The second elevated section 243 of the second lead 241 is electrically and mechanically connected to the inductor assembly 280 by a second conductive material 245. In one example, each of the first conductive material 235 and the second conductive material 245 comprises a powder metallurgy material. In another example, each of the first conductive material 235 and the second conductive material 245 comprises an elastomer material. In examples of the present disclosure, a height of the first elevated section 233 is at least 250 microns above the first die paddle 222 and the second die paddle 224. A height of the second elevated section 243 is at least 250 microns above the first die paddle 222 and the second die paddle 224. As shown, the first end paddle 226 and the first lead 231 are formed as a unitary unit, the second end paddle 228 and the second lead 241 are formed as a unitary unit. Alternatively, the first end paddle 226 and the second end paddle 228 may be formed by conductive spacers stacking on portions of the first lead 231 and second lead 241 respectively (not shown).

The molding encapsulation 290 encloses the low side FET 240, the high side FET 250, the first plurality of bonding wires 291, the capacitor 260, the resistor 270, the inductor assembly 280, a majority portion of the first lead 231, a majority portion of the second lead 241, and a majority portion of the lead frame 220.

In examples of the present disclosure, a bottom surface of the lead frame 220 is exposed from the molding encapsulation 290. A bottom surface of the first lead 231 is exposed from the molding encapsulation 290. A bottom surface of the second lead 241 is exposed from the molding encapsulation 290.

In examples of the present disclosure, an entirety of the inductor assembly 280 is disposed at a position higher than an entirety of the low side FET 240, higher than an entirety of the high side FET 250, and higher than an entirety of the first plurality of bonding wires 291.

In examples of the present disclosure, the power semiconductor package 200 further comprises an integrated circuit (IC) 299 mounted on the second die paddle 224. A second plurality of bonding wires 298 connect the IC 299 to a plurality of leads of the lead frame 220. The molding encapsulation 290 encloses the IC 299.

Figure 3A:
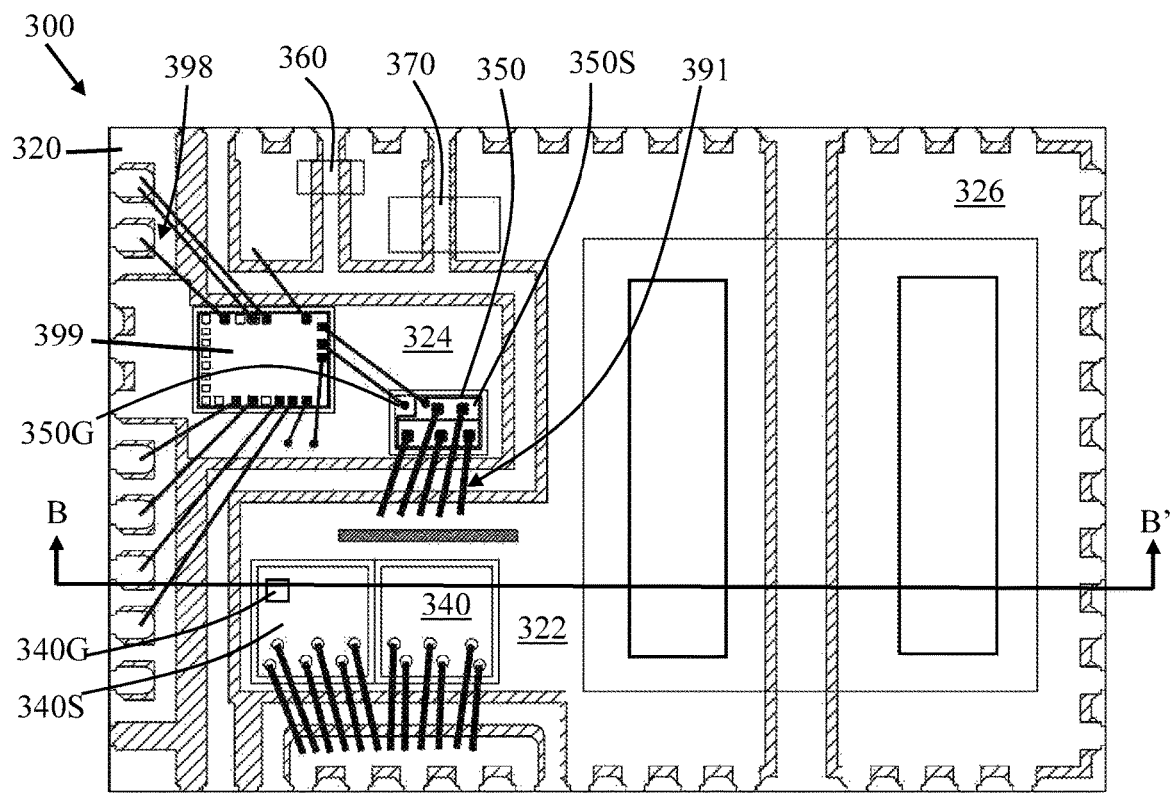
FIG. 3A is a top view and FIG. 3B is a cross sectional plot along BB' of another power semiconductor package in examples of the present disclosure.
Figure 3B:
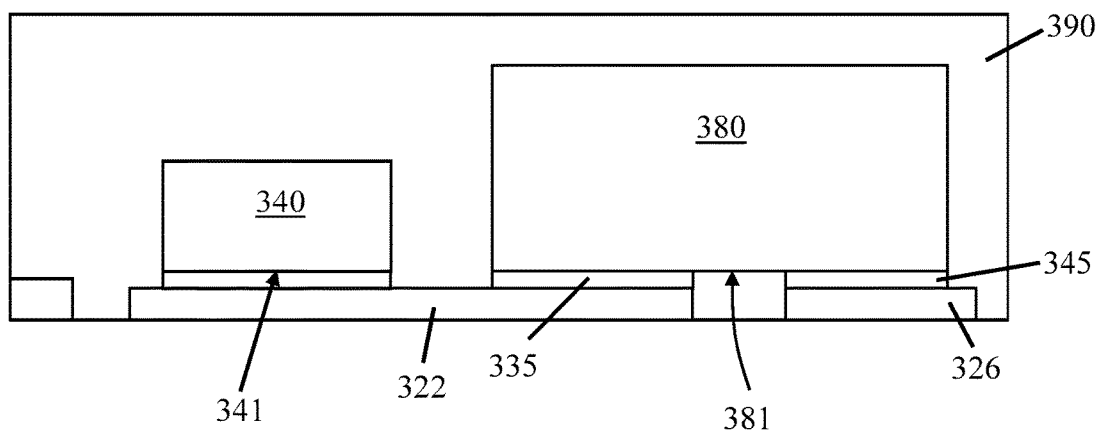

FIG. 3A is a top view and FIG. 3B is a cross sectional plot along BB' of a power semiconductor package 300 in examples of the present disclosure.

The power semiconductor package 300 comprises a lead frame 320, a low side field-effect transistor (FET) 340, a high side FET 350, a capacitor 360, a resistor 370, an inductor assembly 380, a first plurality of bonding wires 391, and a molding encapsulation 390. The lead frame 320 comprises a first die paddle 322, a second die paddle 324 adjacent the first die paddle 322, and a first end paddle 326 first die paddle 322.

The low side FET 340 has a bottom surface drain electrode attached to the first die paddle 322. The low side FET 340 comprises a source electrode 340S and a gate electrode 340G on a top surface of the low side FET 340. The high side FET 350 has a bottom surface drain electrode attached to the second die paddle 324. The high side FET 350 comprises a source electrode 350S and a gate electrode 350G on a top surface of the high side FET. The first plurality of bonding wires 391 connect the top surface source electrode of the high side FET 350 to the first die paddle 322.

The molding encapsulation 390 encloses the low side FET 340, the high side FET 350, the first plurality of bonding wires 391, the capacitor 360, the resistor 370, the inductor assembly 380, and a majority portion of the lead frame 320. In examples of the present disclosure, a bottom surface of the lead frame 320 is exposed from the molding encapsulation 390.

In examples of the present disclosure, a bottom surface 341 of the low side FET 340 and a bottom surface 381 of the inductor assembly 380 are co-planar.

A first terminal of the inductor assembly 380 is electrically and mechanically connected to the first die paddle 322 by a first conductive material 335. A second terminal of the inductor assembly is electrically and mechanically connected to the first end paddle 326 by a second conductive material 345. In one example, each of the first conductive material 335 and the second conductive material 345 comprises a powder metallurgy material. In another example, each of the first conductive material 335 and the second conductive material 345 comprises an elastomer material.

In examples of the present disclosure, the power semiconductor package 300 further comprises an integrated circuit (IC) 399 mounted on the second die paddle 324. A second plurality of bonding wires 398 connect the IC 399 to a plurality of leads of the lead frame 320. The molding encapsulation 390 encloses the IC 399.

Those of ordinary skill in the art may recognize that modifications of the embodiments disclosed herein are possible. For example, a height of the first elevated section 233 and a height of the second elevated section 243 may vary. Other modifications may occur to those of ordinary skill in this art, and all such modifications are deemed to fall within the purview of the present invention, as defined by the claims.

The invention claimed is:

1. A power semiconductor package comprising:
a lead frame comprising
a first die paddle; and
a second die paddle;
a first lead comprising
a first elevated section comprising
a first end paddle;
a second lead comprising
a second elevated section comprising
a second end paddle, wherein the first end paddle and the second end paddle being disposed higher than the first die paddle and the second die paddle;
a low side field-effect transistor (FET) having a bottom surface drain electrode attached to the first die paddle, the low side FET comprising a source electrode and a gate electrode on a top surface of the low side FET;
a high side FET having a bottom surface drain electrode attached to the second die paddle, the high side FET comprising a source electrode and a gate electrode on a top surface of the high side FET;
a first plurality of bonding wires connecting the top surface source electrode of the high side FET to the first die paddle;
an inductor assembly comprising a first terminal and a second terminal, the first terminal stacking on the first end paddle and the second terminal stacking on the second end paddle;
a first conductive material comprising
a top surface directly attached to the inductor assembly; and
a bottom surface directly attached to the first end paddle;
a second conductive material comprising
a top surface directly attached to the inductor assembly; and
a bottom surface directly attached to the second end paddle; and
a molding encapsulation enclosing the low side FET, the high side FET, the first plurality of bonding wires, the inductor assembly, a majority portion of the first lead, a majority portion of the second lead, and a majority portion of the lead frame.

2. The power semiconductor package of claim 1, wherein the first end paddle is adjacent the first die paddle and the second die paddle; and wherein the second end paddle is adjacent the first die paddle and the second die paddle.

3. The power semiconductor package of claim 2, wherein the first elevated section of the first lead is electrically and mechanically connected to the inductor assembly by the first conductive material; wherein the second elevated section of the second lead is electrically and mechanically connected to the inductor assembly by the second conductive material; wherein a top surface of the first elevated section of the first lead is parallel to a bottom surface of the inductor assembly; and wherein a top surface of the second elevated section of the second lead is parallel to the bottom surface of the inductor assembly.

4. The power semiconductor package of claim 3, wherein each of the first conductive material and the second conductive material comprises a powder metallurgy material.

5. The power semiconductor package of claim 3, wherein each of the first conductive material and the second conductive material comprises an elastomer material.

6. The power semiconductor package of claim 3, wherein a bottom surface of the lead frame is exposed from the molding encapsulation.

7. The power semiconductor package of claim 3 further comprising an integrated circuit (IC) mounted on the second die paddle, wherein a second plurality of bonding wires connect the IC to a plurality of leads of the lead frame.

8. The power semiconductor package of claim 7, wherein the molding encapsulation encloses the IC.

9. The power semiconductor package of claim 1, wherein a height of the first elevated section is at least two hundred and fifty microns above the first die paddle and the second die paddle.

10. A power semiconductor package comprising:
    a lead frame comprising
        a first die paddle;
        a second die paddle; and
        a first end paddle;
    a low side field-effect transistor (FET) having a bottom surface drain electrode attached to the first die paddle, the low side FET comprising a source electrode and a gate electrode on a top surface of the low side FET;
    a high side FET having a bottom surface drain electrode attached to the second die paddle, the high side FET comprising a source electrode and a gate electrode on a top surface of the high side FET;
    a first plurality of bonding wires connecting the source electrode of the high side FET to the first die paddle;
    an inductor assembly, a first terminal of the inductor assembly being attached to the second die paddle, and a second terminal of the inductor assembly being attached to the first end paddle;
    a first conductive material comprising
        a top surface directly attached to the first terminal of the inductor assembly; and
        a bottom surface directly attached to the first die paddle;
    a second conductive material comprising
        a top surface directly attached to the second terminal of the inductor assembly; and
        a bottom surface directly attached to the first end paddle; and
    a molding encapsulation enclosing the low side FET, the high side FET, the first plurality of bonding wires, the inductor assembly, and a majority portion of the lead frame.

11. The power semiconductor package of claim 10, wherein a bottom surface of the low side FET and a bottom surface of the inductor assembly are co-planar.

12. The power semiconductor package of claim 10, wherein the first terminal of the inductor assembly is electrically and mechanically connected to the first die paddle by the first conductive material; and wherein the second terminal of the inductor assembly is electrically and mechanically connected to the first end paddle by the second conductive material.

13. The power semiconductor package of claim 12, wherein each of the first conductive material and the second conductive material comprises a powder metallurgy material.

14. The power semiconductor package of claim 12, wherein each of the first conductive material and the second conductive material comprises an elastomer material.

15. The power semiconductor package of claim 12, wherein a bottom surface of the lead frame is exposed from the molding encapsulation.

16. The power semiconductor package of claim 12, further comprising an integrated circuit (IC) mounted on the first die paddle, wherein a second plurality of bonding wires connect the IC to a plurality of leads of the lead frame.

17. The power semiconductor package of claim 16, wherein the molding encapsulation encloses the IC.

18. A power semiconductor package comprising:
    a lead frame comprising
        a first die paddle; and
        a second die paddle;
    a first lead comprising
        a first elevated section comprising
            a first end paddle;
    a second lead comprising
        a second elevated section comprising
            a second end paddle, wherein the first end paddle and the second end paddle being disposed higher than the first die paddle and the second die paddle;
    a low side field-effect transistor (FET) having a bottom surface drain electrode attached to the first die paddle, the low side FET comprising a source electrode and a gate electrode on a top surface of the low side FET;
    a high side FET having a bottom surface drain electrode attached to the second die paddle, the high side FET comprising a source electrode and a gate electrode on a top surface of the high side FET;
    a first plurality of bonding wires connecting the top surface source electrode of the high side FET to the first die paddle;
    an inductor assembly comprising a first terminal and a second terminal, the first terminal stacking on the first end paddle and the second terminal stacking on the second end paddle;
    a first conductive material comprising
        a top surface directly attached to the inductor assembly; and
        a bottom surface directly attached to the first end paddle;
    a second conductive material comprising
        a top surface directly attached to the inductor assembly; and
        a bottom surface directly attached to the second end paddle; and
    a molding encapsulation enclosing the low side FET, the high side FET, the first plurality of bonding wires, the first end paddle, the second end paddle, and the inductor assembly.

* * * * *